United States Patent [19]

Anderson et al.

[11] Patent Number: 5,091,957
[45] Date of Patent: Feb. 25, 1992

[54] WIDEBAND EXPANDER FOR STEREO AND SAP SIGNALS

[75] Inventors: Mark R. Anderson, Indianapolis, Ind.; Robert P. Parker, Westborough, Mass.

[73] Assignee: Thomson Consumer Electronics, Inc., Indianapolis, Ind.

[21] Appl. No.: 511,716

[22] Filed: Apr. 18, 1990

[51] Int. Cl.$^5$ ............................................... H03G 7/00
[52] U.S. Cl. ..................................... 381/106; 333/14; 381/13
[58] Field of Search ..................... 381/106, 13; 333/14

[56] References Cited

U.S. PATENT DOCUMENTS

| | | | |
|---|---|---|---|
| 3,681,618 | 8/1972 | Blackmer | 307/229 |
| 4,177,356 | 12/1979 | Jaeger et al. | 381/103 |
| 4,363,007 | 12/1982 | Haramoto et al. | 333/14 |
| 4,449,106 | 5/1984 | Ishigaki et al. | 333/14 |
| 4,691,234 | 9/1987 | Albean | 358/144 |

OTHER PUBLICATIONS

A Companding System for Multichannel TV Sound, by L. B. Tyler et al., IEEE Transactions on Consumer Electronics, vol. CE-30, No. 4, Nov. 1984.
TV Multichannel Sound-The BTSC System, by C. G. Eilers, IEEE Transactions on Consumer Electronics, vol. CE-31, No. 1, Feb. 1985.
TV Multichannel Sound-The BTSC System, TV Multichannel Sound-Encoding and Transmission, TV Multichannel Sound-Reception and Decoding, IEEE Transactions on Consumer Electronics, vol. CE-30, No. 3, Aug. 1984.
An article entitled "The DBX Television Multichannel Sound Compander: Characterization" by Leslie B. Tyler, 1983.
The Handbook of Industrial Electronic Circuits, McGraw-Hill Book Company, Inc. 1948, pp. 5-9.
A portion of Section-3 of the schematic diagrams for the Magnavox model No. RJ 4340 20" stereo television receiver.

Primary Examiner—Forester W. Isen
Assistant Examiner—Sylvia Chen
Attorney, Agent, or Firm—Joseph S. Tripoli; Peter M. Emanuel; Thomas F. Lenihan

[57] ABSTRACT

A decoding arrangement for decoding audio signals previously encoded in accordance with the dbx format, includes a wideband expander instead of a full dbx expander. The wideband expander employs a relatively simple, and therefore inexpensive, peak detector in place of the true RMS detector of a full dbx expander, and does not include apparatus for spectral expansion of the audio signal. Although the decoding is noncomplementary with respect to the encoding, the stereo audio reproduction as perceived by a listener, is surprisingly good.

10 Claims, 14 Drawing Sheets

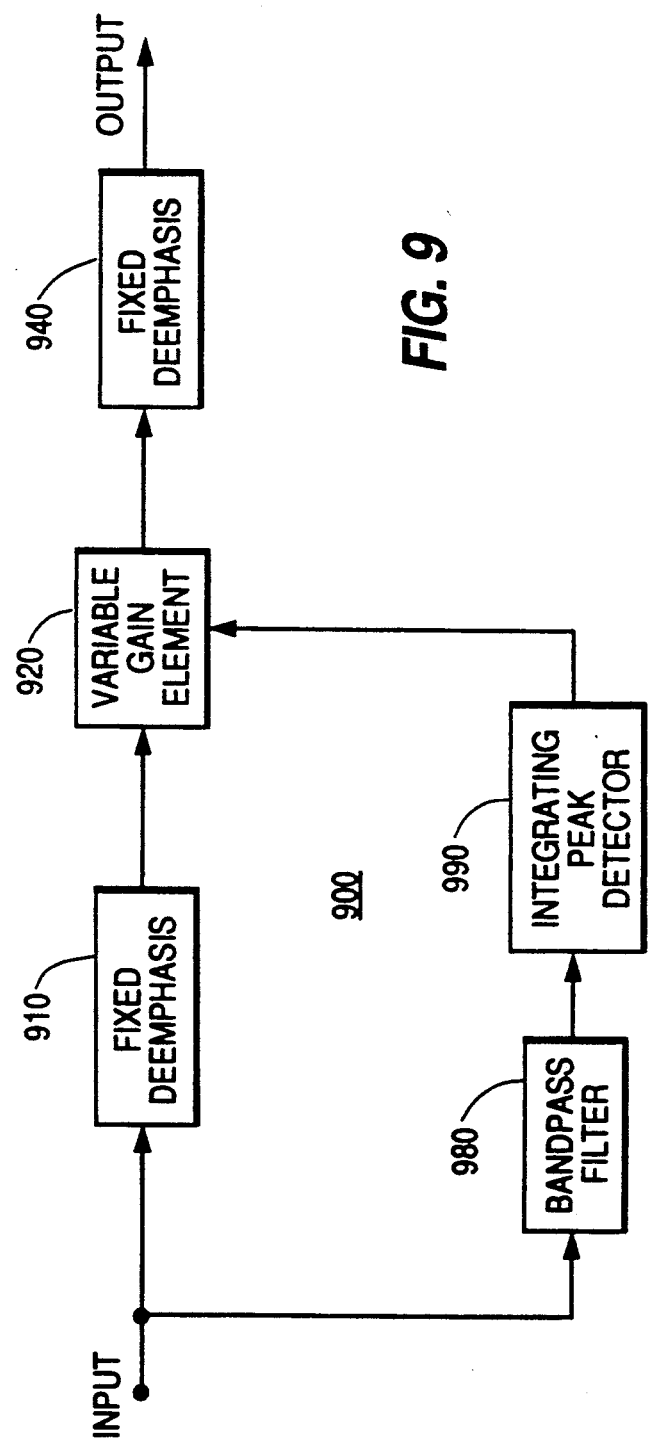

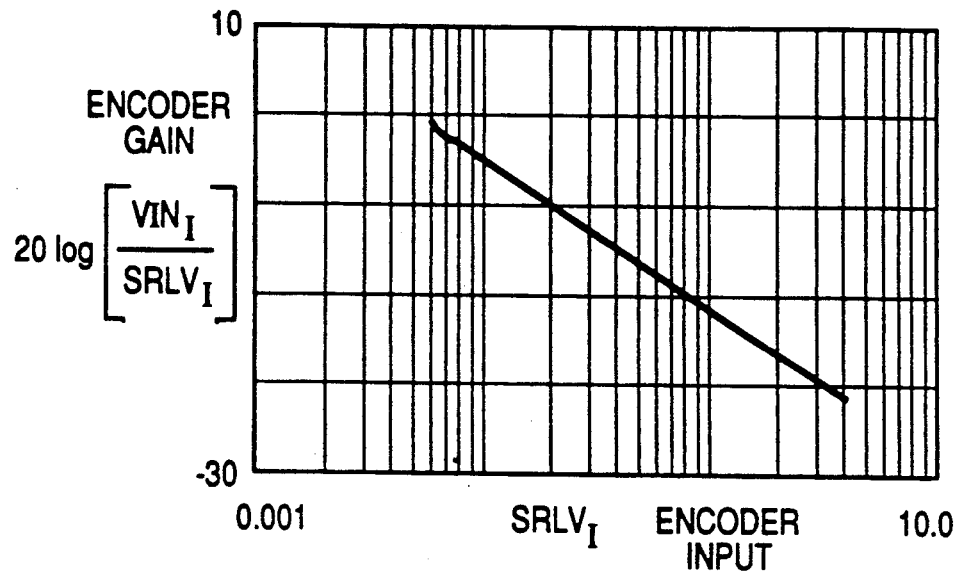
FIG. 11
FIG. 12
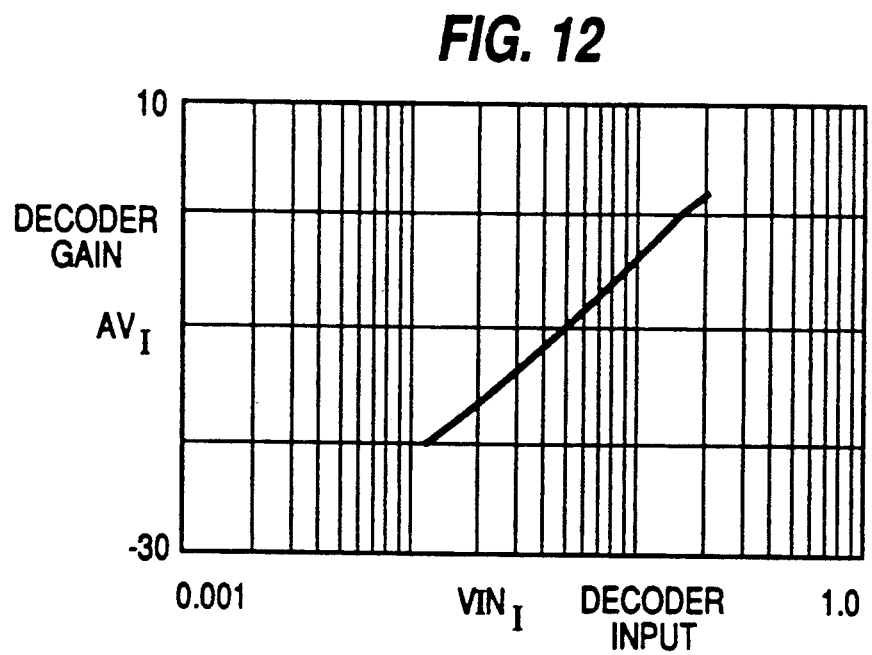

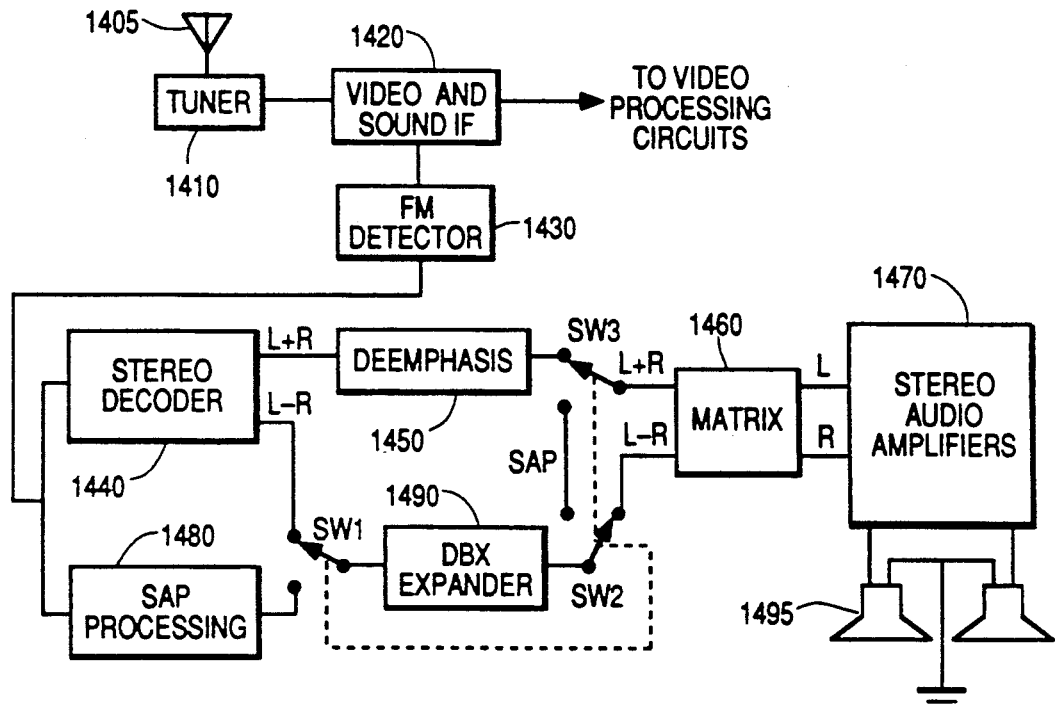
FIG. 14 *PRIOR ART*
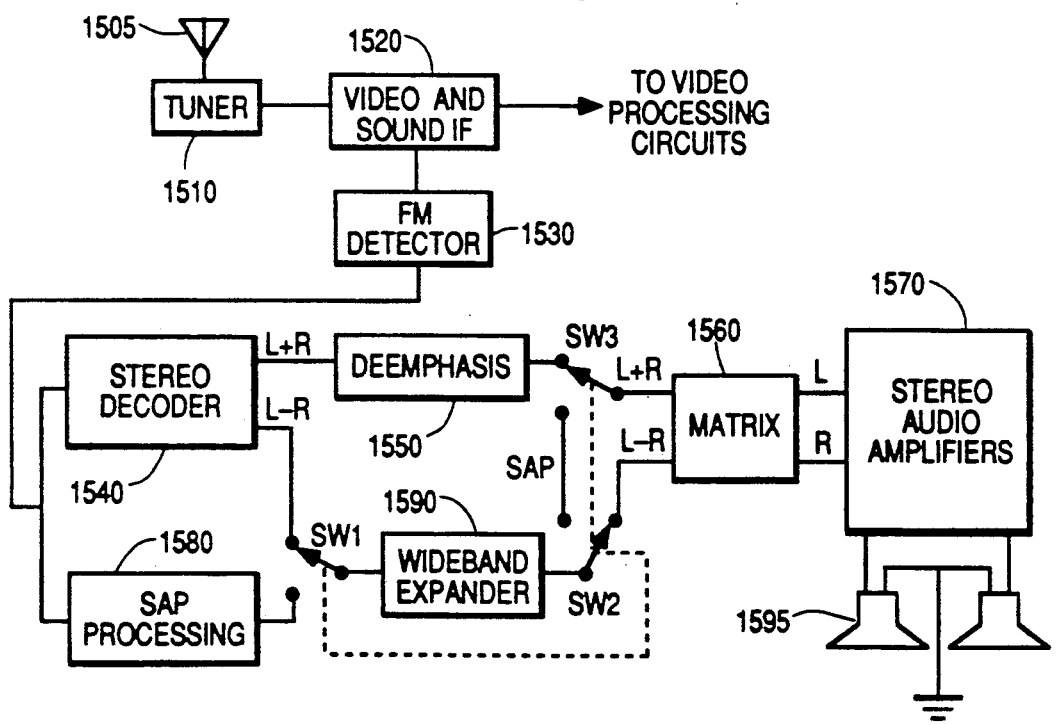
FIG. 15

WIDEBAND EXPANDER FOR STEREO AND SAP SIGNALS

FIELD OF THE INVENTION

The subject application concerns the field of television receivers having signal processing circuitry for decoding stereo signals which were encoded in accordance with the dbx format.

BACKGROUND OF THE INVENTION

The broadcasting of multichannel or stereo sound programs for television in the United States is in accordance with the system adopted by the Broadcast Systems Television Committee (BTSC) of the Electronic Industries Association (EIA). This television multichannel sound system provides for the transmission of the sum of the left and right stereo audio information (L+R) in a main audio channel in the spectrum space of the television signal formerly occupied by the monophonic audio signal (mono). This was done so that new stereo signal would be compatible with existing monophonic television receivers. The television multichannel sound system also provides for the transmission of the difference of the left and right stereo audio information (L−R), modulated onto a subcarrier.

The television multichannel system also provides for the option of simultaneously transmitting a second audio program (SAP) which typically may be used to carry a second language version of the program being provided in the main (L+R) audio channel. The audio frequency of the SAP channel is in the range of 50 Hz to 10 KHz, which is relatively restricted as compared to the 50 Hz to 15 KHz for the main channel and the (L−R) subchannel. The restricted bandwidth of the SAP channel has been deemed to be sufficient for the nature of the bulk of the program material expected to be carried on the SAP channel.

The L−R stereo subchannel and the SAP channel both use subcarriers at frequencies above the audio range and due to the nature of the frequency modulation (FM) transmission system used, these channels tend to exhibit relatively high noise levels in comparison with the main audio channel. Companding is therefore utilized for the stereo subchannel and the SAP channel to provide acceptable noise performance. The companding system presently used is referred to as the "dbx Companding System", or simply the "dbx system". It should be noted that dbx is a registered trademark of Carillon Technologies, Inc of Newton, Mass. The dbx Companding System is described in detail in an article by Leslie B. Tyler et al., in the IEEE Transactions on Consumer Electronics, November, 1984, Volume CE-30, No. 4, pages 6333-640 and in an article by C. G. Eilers, in the IEEE Transactions on Consumer Electronics, February, 1985, Volume CE-31, No. 1, pages 1-7.

The dbx companding system sets out to improve the attainable signal to noise ratio. Fixed and variable preemphasis are applied to the audio signal before transmission. The additional use of variable preemphasis is intended to avoid two problems which may occur when fixed preemphasis is used alone. First, audio signals which contain predominantly high frequencies would be boosted excessively causing overmodulation. Second, low level audio signals lacking sufficient high frequency content would not be sufficiently boosted to mask noise.

The transmitter of a dbx system includes a signal compressor in which the L−R and SAP audio signals are passed in cascade through a fixed preemphasis circuit, a variable preemphasis circuit which is responsive to a first control signal, a variable gain stage which is responsive to a second control signal, and a second fixed preemphasis circuit.

The variable preemphasis circuit provides "spectral compression". In spectral compression, the variable preemphasis circuit reduces high frequency gain when the high frequency content of the audio signal is relatively high, because the level of the high frequency portion of the audio signal is sufficient, by itself, to mask noise introduced in the transmission path. Conversely, the variable preemphasis circuit increases high frequency gain when the high frequency content of the audio signal is relatively low, in order to mask noise introduced in the transmission path. The variable gain stage provides "wideband compression". In wideband compression, gain is reduced when the signal level is high, and conversely, gain is increased when the signal level is low.

According to the dbx system, the first and second control signals are generated by first and second control signal generators, each of which comprises a bandpass filter and a "true RMS" detector A typical "true RMS" detector is known from U.S. Pat. No. 3,681,618 (Blackmer). The first and second control signal generators provide first and second control signals representative of the energy content of the audio signal over first and second respective frequency ranges.

The inverse of the compression operation, known as "expanding", takes place in the receiver so as to restore the audio signal to its original condition. The received L−R and SAP audio signals are passed in cascade through a fixed deemphasis circuit, a variable deemphasis circuit which is responsive to a first control signal, a variable gain stage which is responsive to a second control signal, and a second fixed deemphasis circuit. The variable deemphasis circuit provides spectral expansion. The variable deemphasis circuit increases high frequency gain when the high frequency content of the received audio signal is relatively high, to restore the level of the high frequency portion of the audio signal. Conversely, the variable deemphasis circuit further decreases high frequency gain when the high frequency content of the audio signal is relatively low, in order to attenuate noise introduced in the transmission path. The variable gain circuit provides wide-band expansion. In wide-band expansion, the gain is increased when the level of the audio signal is relatively high, to restore the original signal levels. Conversely, gain is decreased when the signal level is low, to attenuate noise introduced at the receiver.

Just as in the above-described transmitter, a dbx expander includes two control signal generators, each of which comprises a bandpass filter and a "true RMS" detector, for providing the first and second control signals representative of the energy content of the audio signal over first and second respective frequency ranges.

Unfortunately, the dbx decoder circuitry tends to be somewhat complex and requires a relatively large number of electronic components to implement the functions. This is an undesirable characteristic for a circuit which is to be included within a consumer electronic unit, such as a television receiver, in today's highly competitive market. For this reason, television manufacturers have been searching for a low cost alternative to the costly dbx expansion arrangement. There are television receivers having stereo audio capability, which provide no expansion of the compressed L−R audio signal at all. The model no. RJ 4340, produced by Magnavox Corporation, is such a television receiver. Stereo signals in this receiver are derived by matrixing the sum (L+R) stereo signal from the main audio channel and the unexpanded difference (L−R) stereo signal from the stereo subchannel. Not surprisingly, the stereo image separation performance and noise masking performance of this arrangement has been found to be inadequate over the full range of audio signals received, due to the complete elimination of the dbx decoding circuitry from this receiver. The poor noise masking performance of this receiver causes a perceptible hiss in the reproduced stereo audio sound.

SUMMARY OF THE INVENTION

It is herein recognized that for practical purposes, satisfactory restoration of an L−R audio signal compressed according to the dbx format can be achieved without spectral expansion. A decoder according to the subject invention provides a modified fixed deemphasis and wide-band expansion of the received compressed L−R audio signal, but does not provide spectral expansion. It is further recognized that the relatively complex "true RMS" detectors of the dbx system can be replaced with simpler, lower cost integrating peak detectors.

BRIEF DESCRIPTION OF THE DRAWING

FIG. 9 shows, in block diagram form, an apparatus suitable for practicing the invention.

FIG. 11 is a graph of encoder gain for an encoder used to evaluate the operation of the circuitry of FIG. 10.

FIG. 12 is a graph of decoder gain for a decoder used to evaluate the operation of the circuitry of FIG. 10.

FIG. 14 shows, in block diagram form, a television receiver having BTSC multichannel sound capability.

FIG. 15 shows, in block diagram form, a television receiver incorporating the subject invention.

DETAILED DESCRIPTION OF THE EMBODIMENT

Figure 1:
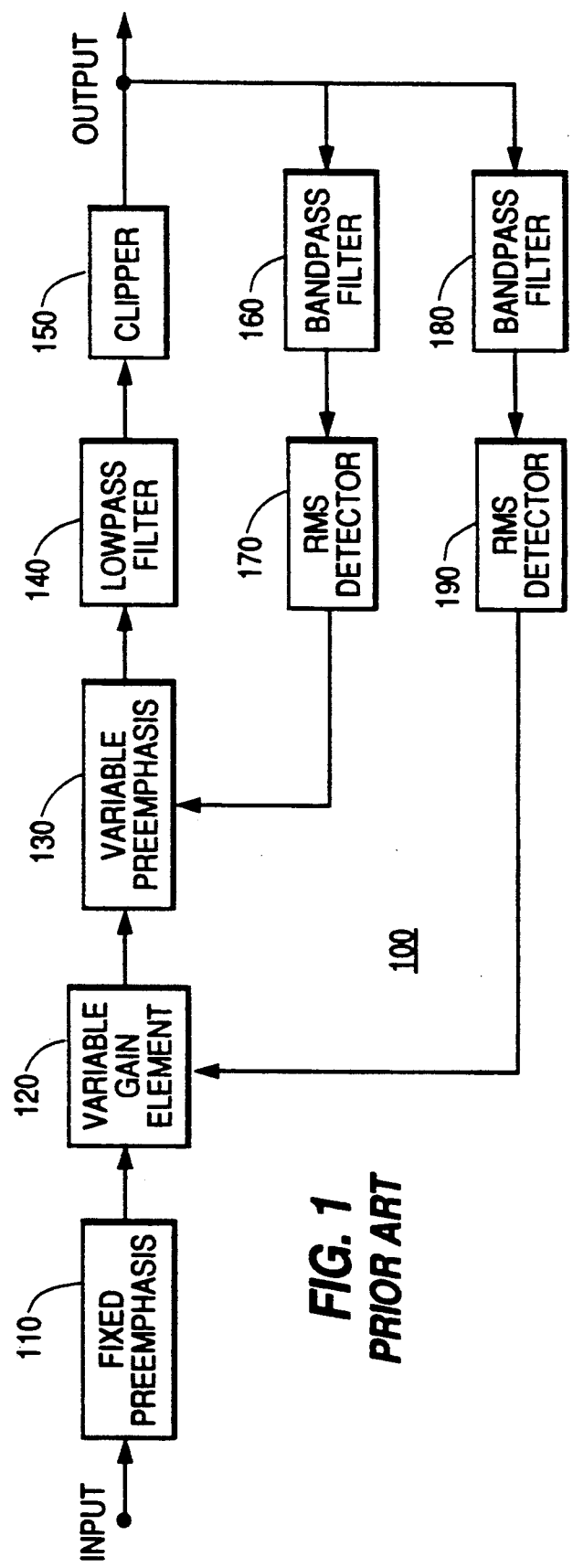
FIG. 1 shows, in block diagram form, a dbx compressor as known from the prior art.
Figure 6:
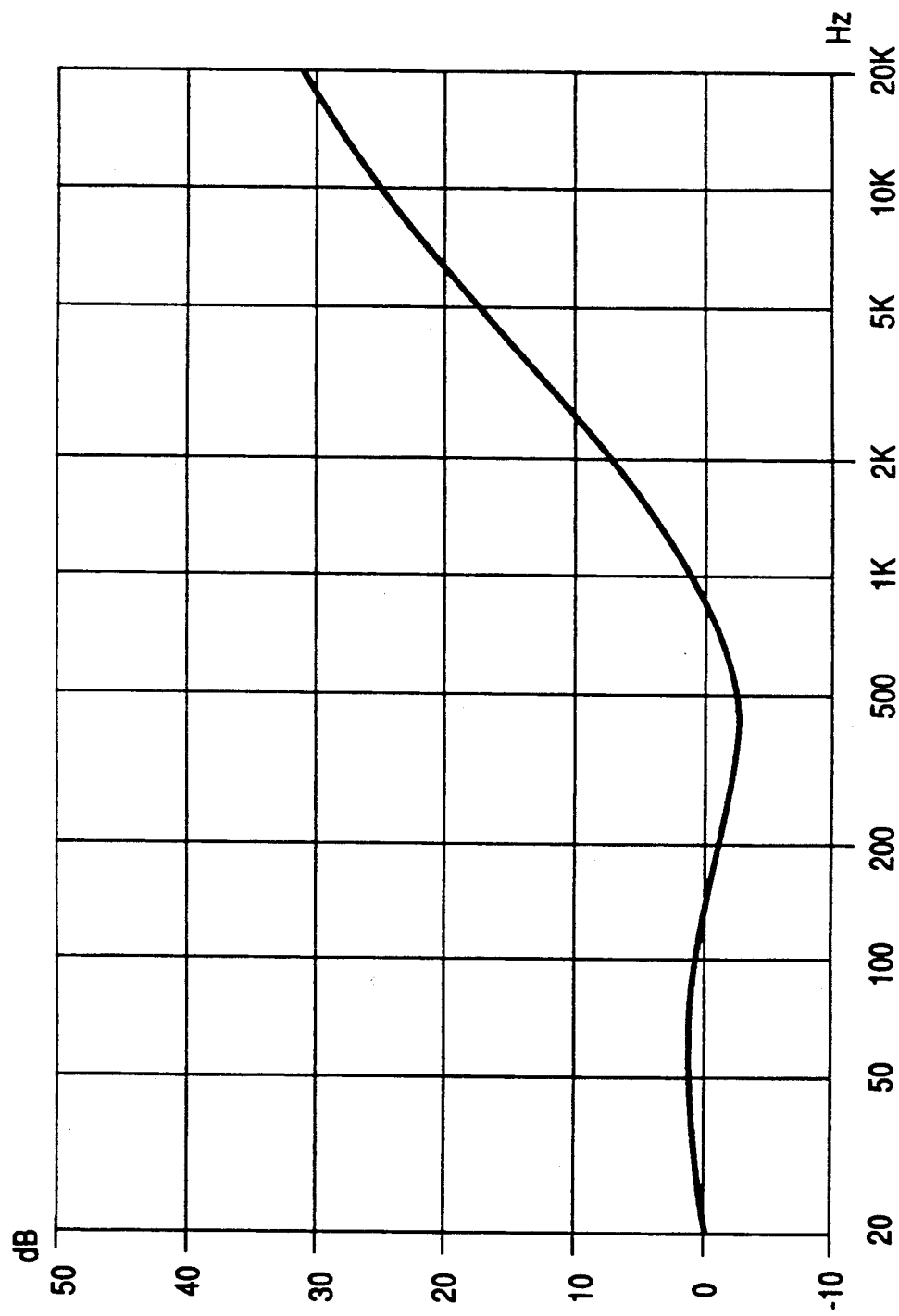
FIG. 6 is a graph of the frequency response of the fixed frequency preemphasis network of the dbx system of FIG. 1.

FIG. 1 shows a dbx compressor 100 utilized to compress the L−R and SAP components of a multichannel sound signal prior to transmission. Dbx compressor 100 includes a fixed preemphasis unit 110 which emphasizes the high frequency portion of L−R and SAP audio signals and applies the emphasized audio signals to a variable gain element 120. The frequency response of fixed preemphasis unit 110 is illustrated in FIG. 6. Preemphasis unit 110 is configured as a high pass filter which passes unaffected the high frequency portion of the signal while attenuating the low frequency portions, and a wideband gain stage which uniformly amplifies all of the frequency portions of the signal. In this way, compensation for the attenuation of the low frequency signals by the high pass filter is provided. The overall effect of this process is that the higher frequencies appear to be "emphasized".

Figure 3:
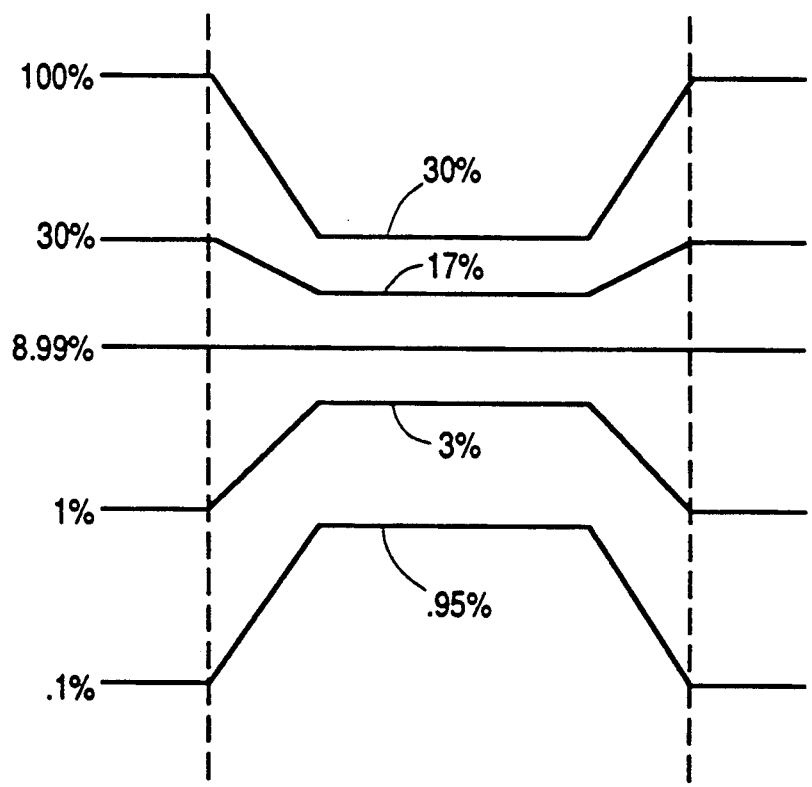
FIG. 3 is a graphical expression useful in understanding the compression and expansion of signals, as known from the prior art.
Figure 5:
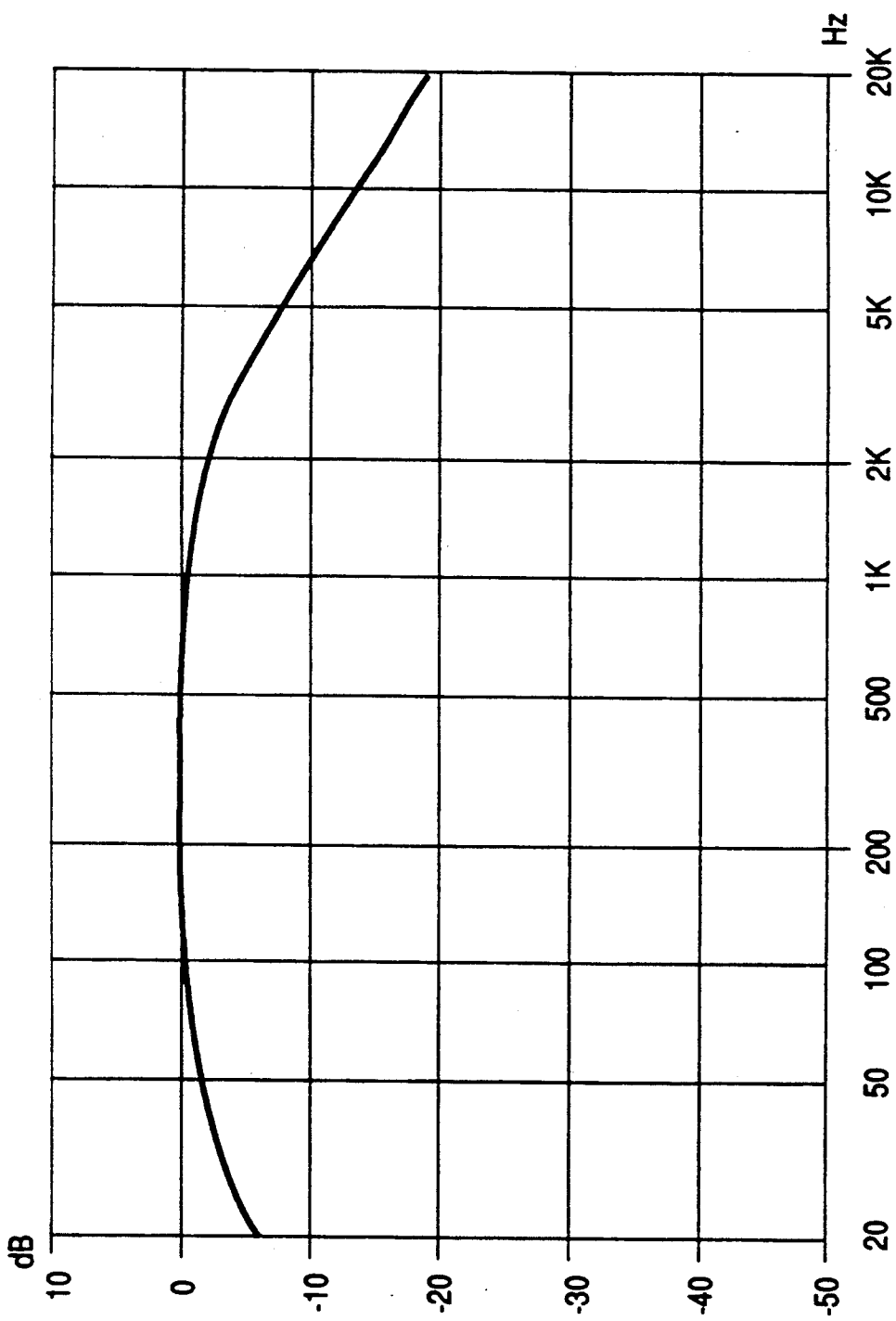
FIG. 5 is a graph of the frequency response of the variable gain stage control path filter of the dbx system of FIG. 1.

Ignoring blocks 130-150 for a moment, the operation of variable gain element 120 can be explained as follows with respect to FIG. 3. Variable gain element 120 provides the function of wideband signal compression. The gain of variable gain unit 120 is controlled in response to a control signal developed by a bandpass filter 180 having a passband as shown in FIG. 5, and a true RMS detector 190. The wideband compression not only raises the level of low amplitude signals, but also attenuates the level of high amplitude signals. FIG. 3 is a graphical representation of the operation of the wideband portion of the dbx companding system. In FIG. 3, signals at the compressor input are shown at the left of the drawing. The percentages shown in the drawing indicate percent of modulation of the L−R subcarrier. Note that at 8.99% modulation the signal is "unaffected". The output signals of the expander are illustrated at the right hand side of FIG. 3, and indicate complete reconstruction of the original signal.

Figure 4:
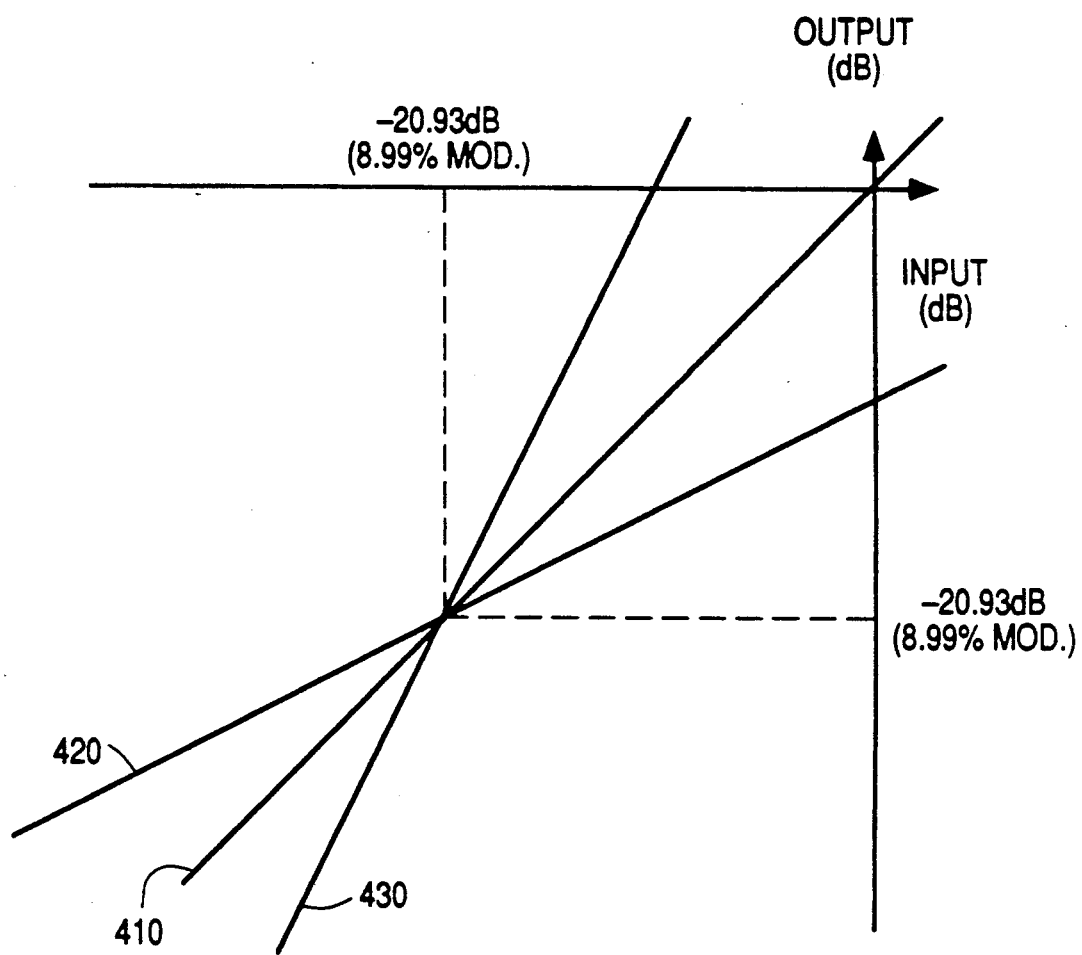
FIG. 4 is a transfer characteristic useful in understanding compression and expansion according to the dbx system of FIGS. 1 and 2.

FIG. 4 is provided as a further aid in understanding the wideband compression function of the dbx system. FIG. 4 shows a line 410, the slope of which is indicative of a transfer function in which input signals of all amplitudes are unaffected. Note that line 410 passes through the 8.99% modulation point mentioned above. A line 420 illustrates a compression ratio of 2:1 for the dbx system. A line 430 illustrates the complementary expansion ratio of 1:2 of the dbx system.

Figure 7:
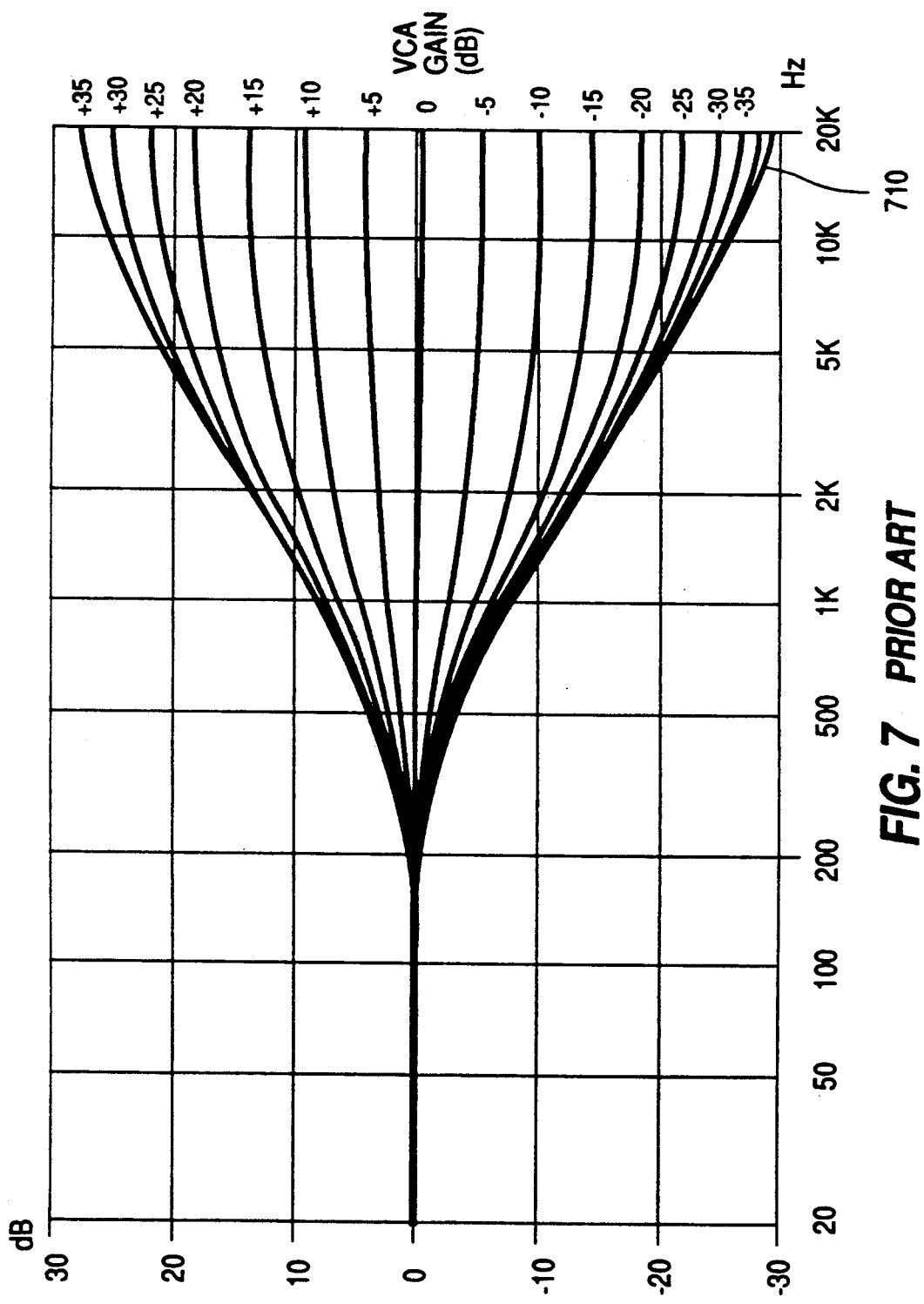
FIG. 7 is a graph of the family of curves of the spectral compression network of the dbx system of FIG. 1.
Figure 8:
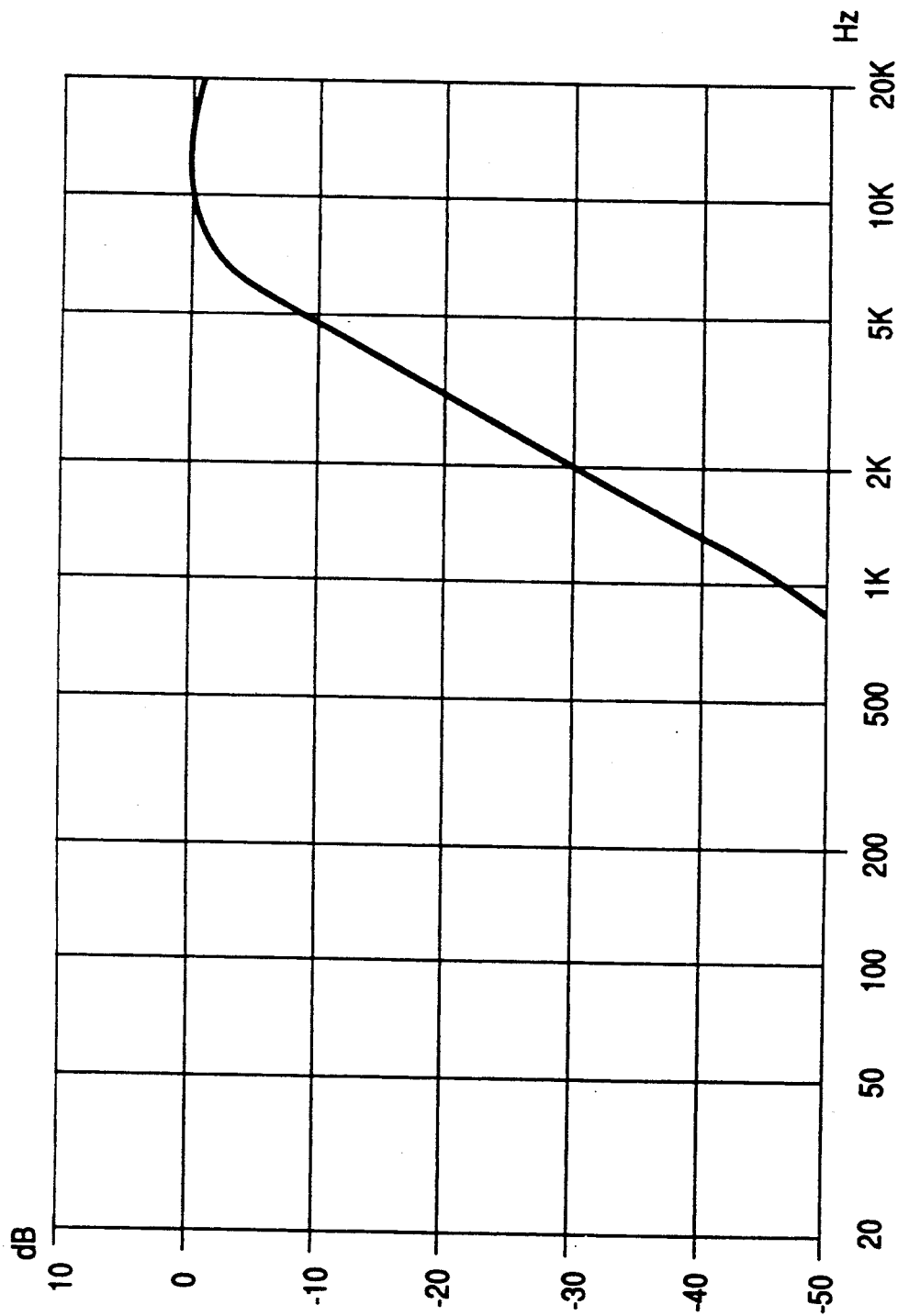
FIG. 8 is a graph of the frequency response of the spectral compression control path filter of the prior art dbx system of FIG. 1.

Returning now to FIG. 1, a variable preemphasis unit 130 receives the output signal of wideband expander 120. Variable preemphasis unit 130 provides the function of spectral compression in response to a control signal developed by control path bandpass filter 160 and true RMS detector 170. Units 160 and 170 monitor the high frequency content at the output of signal compressor arrangement 100 and vary the spectral compression accordingly. FIG. 8 shows the frequency response of the spectral expansion control path filter unit 160. If the audio signal has a high level of high frequency content, then variable preemphasis unit 130 is controlled to deemphasize the high frequency portion of the signal. Conversely, if the audio signal has a low level of high frequency content, then the high frequency portion of the signal is emphasized. A family of curves illustrating the above-described operation of the spectral compression performed by variable preemphasis unit 130 is shown in FIG. 7.

Returning once again to FIG. 1, in addition to the compressed L−R audio signal, variable gain unit 120 and variable preemphasis unit 130 also produce unwanted high frequency signals (i.e., high frequency products) due to the changing control signals which modulate the audio signal being amplified. A lowpass filter 140 is provided to attenuate any high frequency products of the spectral compression and wideband compression which may have been generated. A clipper 150 is provided to prevent overmodulation of the L−R subcarrier.

Figure 2:
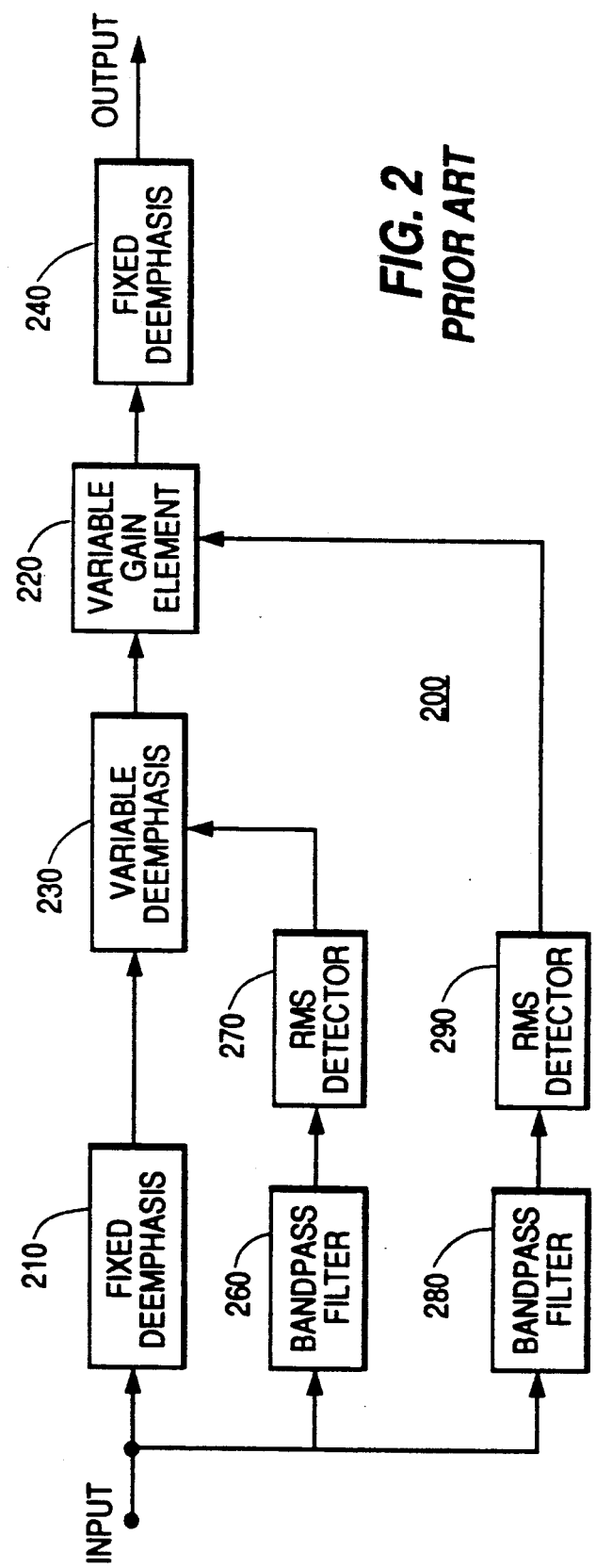
FIG. 2 shows, in block diagram form, a dbx expander as known from the prior art.

It was intended by the developers of the dbx system that the decoder be a "mirror image" of the encoder, so that the encoded audio signal could be accurately reconstructed by the decoder. Such a mirror-image decoder is illustrated in FIG. 2. The units of FIG. 2 bearing similar reference numbers to corresponding units of FIG. 1 perform the complementary function performed in FIG. 1.

A fixed deemphasis is applied to the incoming (L−R) stereo difference signal, or second audio program (SAP) signal, by fixed deemphasis unit 210. A spectral expansion is applied to the deemphasized audio signal by variable deemphasis unit 230 in response to a control signal developed by bandpass filter 260 and true RMS detector 170. Wideband expansion is applied to the audio signal by variable gain element 220 in response to a control signal developed by bandpass filter 280 and true RMS detector 290, a fixed deemphasis (i.e., a fixed amount of low pass filtering) is applied to the expanded audio signal by fixed deemphasis unit 240 in order to attenuate high frequency products which may have been generated in the expansion process.

The subject invention will now be described with respect to the remaining FIGURES. The units of FIG. 9 bearing similar reference numbers to corresponding units of the decoder of FIG. 2 perform the functions as their counterparts in FIG. 2.

There are three significant differences between the arrangement of FIG. 9 and the arrangement of the prior art as shown in FIG. 2. Despite the teaching of the prior art, it has been found that the decoder does not have to be a mirror-image of the encoder.

First, it is herein recognized that spectral expansion of the compressed dbx audio signal is not necessary for the reproduction of an acceptable stereo signal. Accordingly, the variable deemphasis unit 230, its associated control path filter 260, and its associated true RMS detector are completely eliminated from the arrangement of FIG. 9.

Figure 9A:
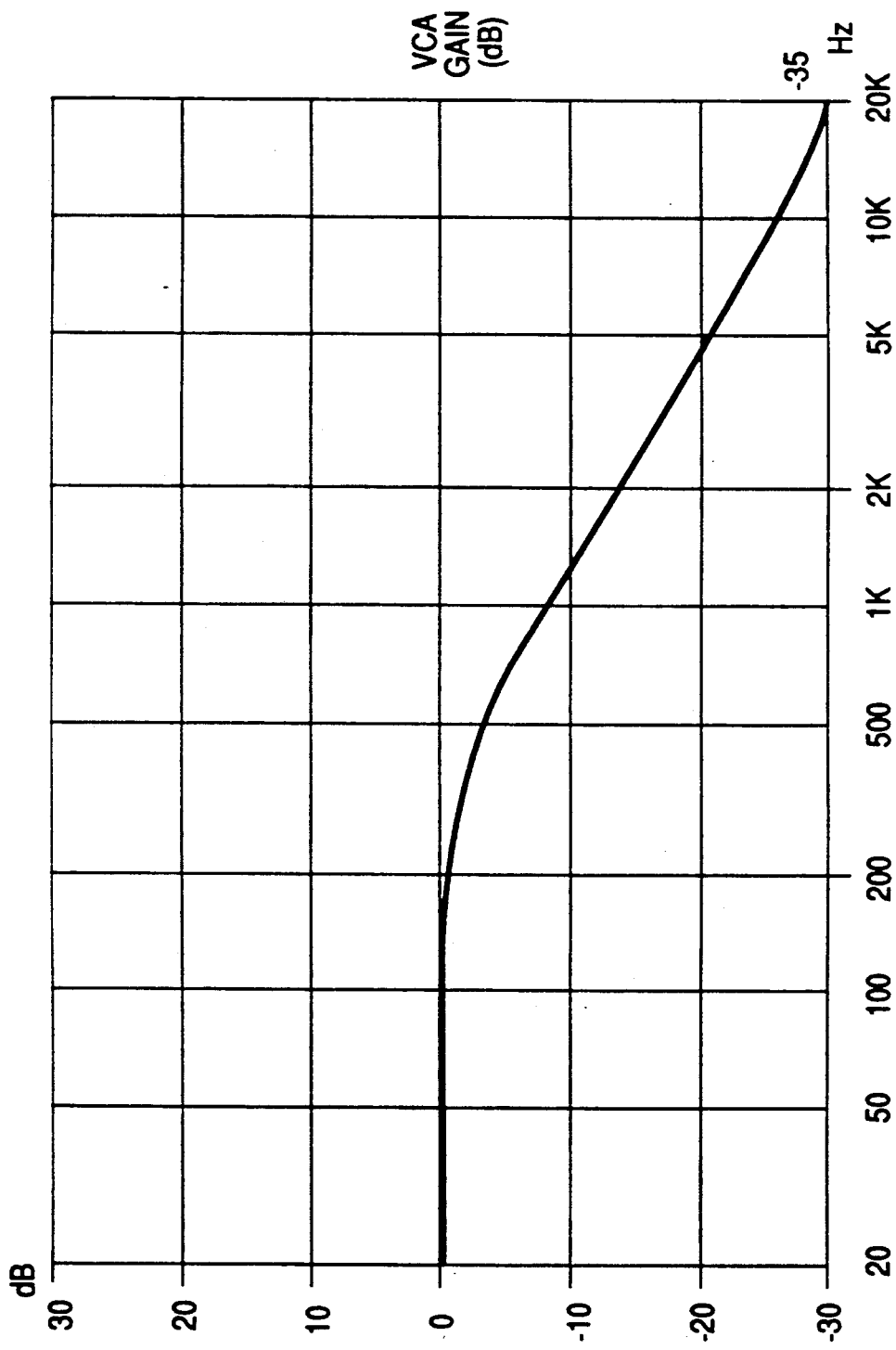
FIG. 9a is a graph of the frequency response of the fixed deemphasis network of FIG. 9.

Second, the rolloff frequency of the fixed deemphasis networks has been changed from that of the prior art to compensate for some of the lost variable deemphasis caused by elimination of the spectral expansion elements. The frequency characteristic of the deemphasis networks of the subject invention is shown in FIG. 9a.

Third, the true RMS detector 290 of the prior art has been replaced by a much lower cost and more simply constructed integrating peak detector. It is believed that the substitution in the control path of an integrating peak detector for the more costly true RMS detector is possible for at least two reasons. First, it is well-known that there is a mathematical relationship between peak and RMS values of a sine wave (i.e., RMS=0.707 peak). It is herein recognized that passing the compressed audio signal through narrow bandwidth filter 980 removes high frequency harmonics of the signals in the frequency range of interest, and produces a signal which is largely composed of a series of sine waves. Thus, peak detection produces a relatively accurate representation of the filtered signal according to the above-given mathematical expression. Second, clipper 150 limits the signal amplitude to prevent overmodulation at the transmitter. The effect of the clipping action on the reproduced signal is largely inaudible if clipper 150 is permitted to limit only short duration transients. True RMS detectors can operate quickly enough to minimize the duration of the transients before they are passed to clipper 150. However, the transient problem, noted above, is largely due to short duration high frequency components of the audio signal. These high frequency components are filtered out by the relatively narrow bandwidth control path filter, whose characteristic is shown in FIG. 5. In theory, it is noted that a transient may not be as completely detected by a peak detector as by a true RMS detector, causing the variable gain element to fail to increase the gain as much as it should it response to the transient. In practice, however, it has been found when decoding actual compressed stereo difference signals that this arrangement performs surprisingly well. The integration function provided by the integrating peak detector tends to average the peaks and valleys of the detected signal. While the control signal provided by this arrangement is not the true RMS (root-mean-square) value of the compressed audio signal, it is felt to be a suitable compromise in terms of performance versus cost and complexity. For these reasons, a simple, low cost, integrating peak detector may be used in place of the more complex and expensive true RMS detector to provide a control signal indicative of the level of the compressed dbx audio signal, even though the two are not normally interchangeable.

The fixed deemphasis provided by units 910 and 940 eliminate the hiss problems noted above with respect to the Magnavox system (having no decoding at all). The fixed deemphasis curve provided by the combination of units 910 and 940 is illustrated in FIG. 9a. The curve of FIG. 9a is chosen to be the same as the lowest deemphasis curve 710 of the family of curves of the variable preemphasis unit of the prior art as shown in FIG. 7. Note that the curve of FIG. 9a has a much lower break point in frequency (approximately 300 Hz) than does the curve of the fixed preemphasis unit of the prior art (approximately 1.5 kHz), as illustrated in FIG. 6. It has been found that the lower rolloff frequency of the deemphasis units of the subject invention alleviate a buzz beat problem which causes a noticeable noise in the speech range of the SAP signal. The buzz beat problem is caused by interfering signals (i.e., video products) which lie within the SAP band. The lower rolloff frequency of deemphasis units 910 and 940 also provides a constant high frequency noise reduction, which further improves the audio signal as perceived by a listener.

The wideband expansion provided by variable gain element 920 in response to control signals developed by units 980 and 990, substantially restores the dynamic range of the original signal, and cures the stereo separation problem at high signal levels noted above with respect to the Magnavox system.

Figure 10:
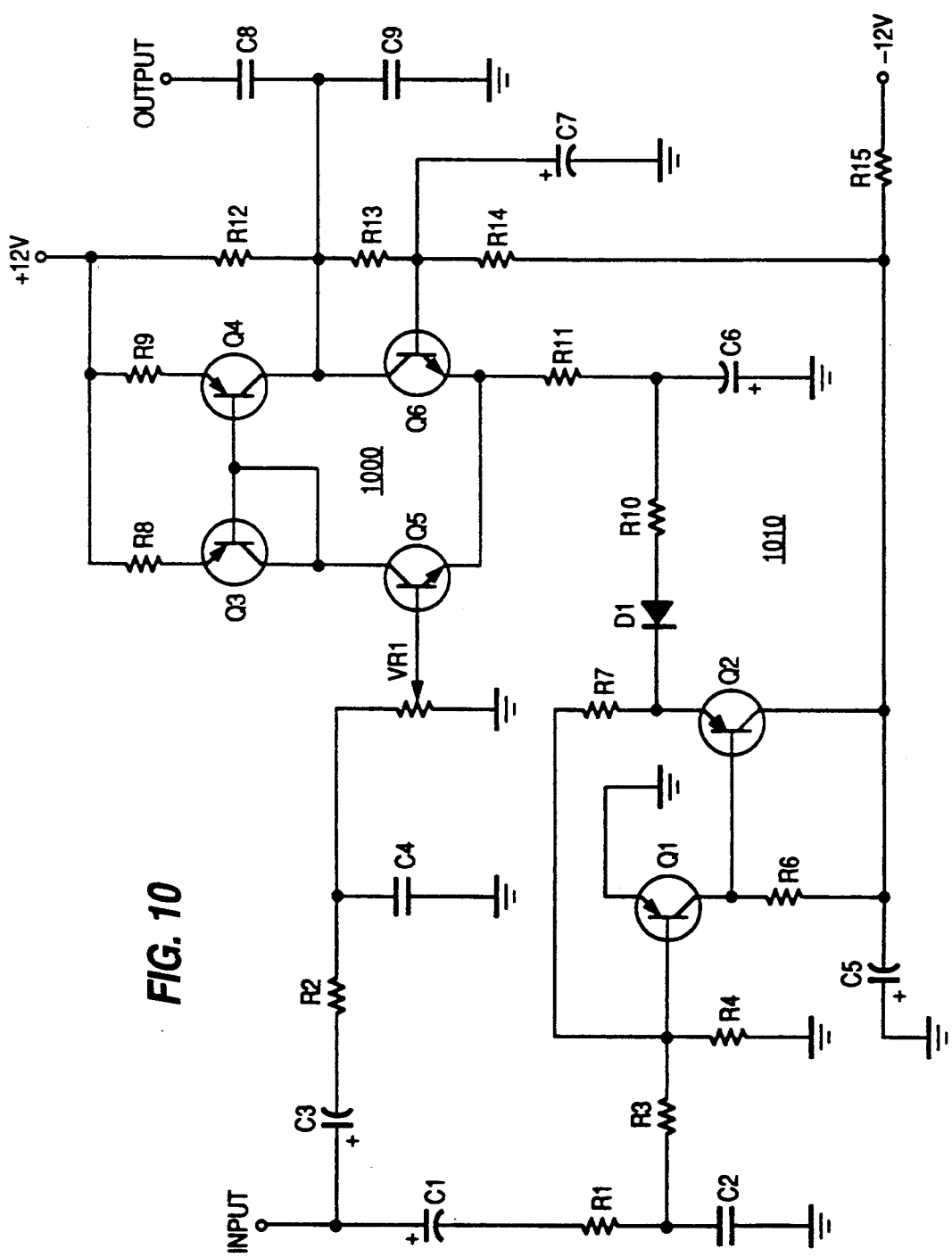
FIG. 10 shows, in schematic form, a detailed embodiment of the block diagram of FIG. 9.

FIG. 10 shows a detailed embodiment of the decoder of FIG. 9. Referring to FIG. 10, the compressed stereo difference signal (L−R) or the SAP signal is applied to an input terminal. The compressed audio signal to be expanded is coupled via capacitor C1 to a fixed deemphasis circuit comprising resistor R2 and capacitor C4, and a level adjustment potentiometer VR1. The signal is taken from the wiper of potentiometer VR1 and applied to one input of an amplifier generally designated 1000, comprising transistors Q5 and Q6, connected as a differential pair. The level adjustment is performed at the input, rather than at the output to keep the input signal as small as possible to optimize the linearity of amplifier 1000 by ensuring that the differential pair is not driven into saturation. Differential amplifier 1000 corresponds to variable gain element 920 of FIG. 9. The collectors of transistors Q5 and Q6 are connected to respective inputs of a current mirror circuit comprising transistors Q3 and Q4 and resistors R8 and R9. The other input of differential amplifier 1000 (i.e., the base of transistor Q6) is connected to a bias voltage source comprising a voltage divider including resistors R12, R13, and R14. It is common practice in differential amplifier design to use "matched pair" of transistors. The biasing arrangement of R12, R13, and R14 allows the use of unmatched transistors because the bias signal applied to the base of transistor Q6 corrects for any mismatching of transistors Q5 and Q6. The bias signal applied to the base of transistor Q6 is filtered by a bypass capacitor C7 to remove any AC component which may be present.

Capacitor C1, resistor R1, resistor R3, and capacitor C2 form a bandpass filter for the control path. This bandpass filter corresponds to bandpass filter 980 of FIG. 9. Resistor R3 also limits the signal current to the base of amplifying transistor Q1. Resistor R4 provides DC bias to transistor Q1, and is selected to adjust the curvature at the low end of the plot of decoder gain versus decoder input illustrated in FIG. 12. The output signal from transistor Q1 is taken from its collector. The collector of Q1 is returned to a source of negative potential via resistor R6. The output signal from transistor Q1 is applied to the base of a buffer transistor Q2. The signal at the emitter of transistor Q2 is opposite in phase to the signal at the base of transistor Q1. Connecting the emitter of transistor Q2 to the base of transistor Q1 via resistor R7 affects the gain and also provides negative feedback to stabilize the arrangement. It should be noted that the amplifier arrangement of Q1 and Q2 is biased to amplify only the negative excursions of its input signal. The negative supply voltage for operating the transistor arrangement of Q1 and Q2 is filtered and decoupled by the combination of capacitor C5 and resistor R15 to prevent current pulses from the wideband expander from being coupled into the power supply.

The interconnected emitters of transistors Q5 and Q6 of differential amplifier 1000 serve as the gain control input terminal of the amplifier. The control path signal developed at the emitter of transistor Q2 is applied to an integrating peak detector 1010 comprising a diode D1, a resistor R10, a capacitor C6, and a resistor R11. Diode D1 is arranged to detect negative excursions of the signal. The negative excursions are applied to charge capacitor C6 via resistor R10 which controls the attack time constant of the peak detector. The capacitor C6 is discharged via resistor R11 which controls the decay time constant of the peak detector. Resistor R11 and capacitor C6 form a current source which varies with the amplitude of the integrated peak detected signals to control the gain of differential amplifier 1000.

The expanded stereo difference signals are taken from the collectors of transistors Q4 and Q6, filtered by a low pass filter comprising resistors R12 and R13 and capacitor C9, and coupled to the output by a coupling capacitor C8. Resistors R12 and R13 also serve to convert the output signal current of the differential amplifier to an output voltage. The final low pass filter comprising R12, R13, and C9 corresponds to fixed deemphasis unit 940 of FIG. 9.

Figure 13:
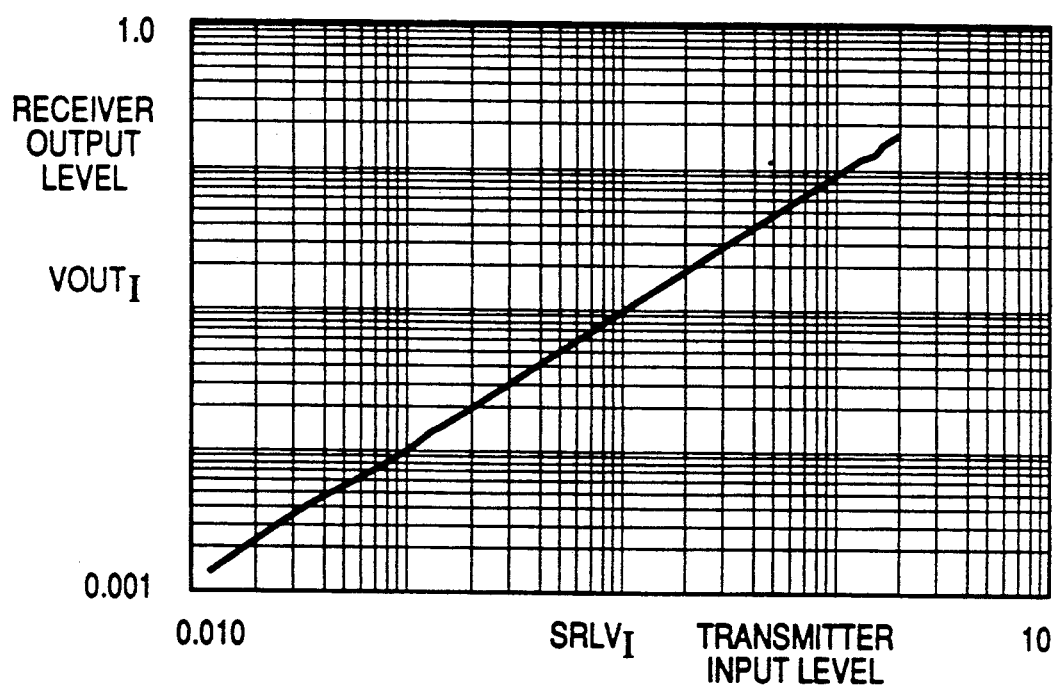
FIG. 13 is a graph showing the overall system linearity of the circuitry of FIG. 10.

FIGS. 11-13 are useful for evaluating the performance of the subject system. FIG. 11 shows the gain of a dbx encoder used to evaluate the decoder of the subject invention. FIG. 12 shows the complementary performance of the subject decoder. FIG. 13 illustrates overall system linearity from transmitter input to decoder output.

FIG. 14 shows a television receiver, as known from the prior art, having BTSC multichannel television sound (MTS) capability. Broadcast television signal are received by an antenna 1405 (or coupled to the receiver via a cable television system) and applied to a tuner 1410 for channel selection. Tuner 1410 converts a selected one of a plurality of received television signals from its respective broadcast frequency to a common intermediate frequency (IF). The IF frequency television signal is applied to a video and sound IF unit 1430 which produces a baseband video signal and a frequency modulated (FM) sound carrier. The video and audio signals are separated, and the video signals are applied to video signal processing circuitry, not shown.

A composite multichannel sound audio signal is detected from the FM sound carrier by an FM detector 1430 and applied to a stereo decoder 1440. Stereo decoder 1440 provides an L+R stereo sum signal and an L−R stereo difference signal.

In the remainder of the arrangement shown, switches SW1, SW2, and SW3 have a first position for selecting stereo audio signals, and a second position for selecting SAP audio signals. The dotted lines through switches SW1, SW2, and SW3 indicate that they are "ganged together" (i.e., coupled together for simultaneous operation), and are shown in the stereo signal selection position. The (L+R) stereo sum signal is deemphasized in a deemphasis unit 1450 (i.e., a low pass filter having the appropriate time constant) and applied, via switch SW3, to one input of a stereo matrixing unit 1460 in which the original left (L) and right (R) stereo signals are reconstructed. The (L−R) stereo difference signal from stereo decoder unit 1440 is applied via switch SW1 to dbx expander unit 1490. Dbx expander unit 1490 corresponds to a full dbx expander as shown in FIG. 2. The expanded (L−R) stereo difference signal is applied to the other input of stereo matrix unit 1460 via switch SW2. The reconstructed left (L) and right (R) stereo signals are applied to stereo audio amplifier unit 1470 for amplification and ultimate reproduction in a dual speaker unit 1495.

The detected audio signal is also applied to a second audio program (SAP) processing unit 1480. If the second audio program is desired, switches SW1, SW2, and SW3 are switched to the opposite position. Changing the position of SW1 disconnects the stereo signal from dbx expander unit 1490, and connects the detected SAP signal. Changing the positions of switches SW2 and SW3 disconnects the stereo signals from matrix unit 1460, and causes the SAP signal to be applied to the L+R input of matrix unit 1460. The dbx expander can be shared in this way because one never listens to stereo audio and the SAP channel at the same time.

FIG. 15 is an example of a television receiver incorporating the subject invention. Blocks having similar reference numbers in FIGS. 14 and 15 perform the same functions, with the exception of wideband expander block 1590. Block 1590 corresponds to the wideband expander of the subject invention as shown in FIG. 9, and completely replaces the full dbx expander of block 1490.

The term television receiver, as used herein, includes television receivers having a display device (commonly known as television sets) and television receivers without a display device, such as VCRs. It is also noted that some FM radios have the capability of receiving and reproducing television sound signals. As such, the stereo decoder/expander portion of the television receiver shown in FIG. 15 may be used in such FM radios.

What is claimed is:

1. A wideband expander circuit for decoding audio signals which have been encoded in accordance with the dbx companding system including both spectral compression and wideband compression, comprising:
    an input for receiving said dbx encoded audio signals;
    means exhibiting a fixed lowpass filter characteristic and coupled to said input for receiving said dbx encoded audio signals, said lowpass filter means applying a fixed deemphasis to said encoded audio signals and producing a deemphasized audio signal at a first output;
    means for amplifying audio signals, said amplifying means having a signal input coupled to said first output for receiving said deemphasized audio signals, having a control input for receiving a gain control signal, and having an output at which amplified signals are developed;
    means exhibiting a bandpass filter characteristic and coupled to said input for receiving said dbx encoded audio signals, and producing a control signal at a second output;
    means for detecting the peak amplitude of a signal, said peak detecting means having an input coupled to said second output for receiving said control signal, and having an output at which a peak detected control signal is developed; and
    means for integrating a signal, said integrating means having an input coupled to said output of said peak detecting means for receiving said peak detected control signal, and an output at which is developed said gain control signal, said output of said integrating means being coupled to said control input of said amplifier means;
    said wideband expander including no variable deemphasis means for performing spectral expansion of said dbx encoded audio signal.

2. The wideband expander of claim 1, wherein said peak detector means detects negative transitions of said control signal.

3. The wideband expander of claim 1, further comprising:
    a second means exhibiting a fixed lowpass filter characteristic and coupled to said output of said amplifier means for receiving said expanded audio signals, said second lowpass filter means applying a second fixed deemphasis to said expanded audio signals and producing further filtered audio signals at an output.

4. The wideband expander of claim 1, wherein said amplifying means is a differential amplifier.

5. In a television receiver, a wideband expander circuit for decoding audio signals which were encoded in accordance with the BTSC multichannel sound system standard including dbx companding, comprising:
    means exhibiting a fixed lowpass filter characteristic and having an input for receiving said dbx encoded audio signals, said lowpass filter means applying a fixed deemphasis to said encoded audio signals and producing a deemphasized audio signal at a first output, said lowpass filter characteristic exhibiting a rolloff at a frequency less than half of the rolloff frequency exhibited by fixed lowpass filters of the dbx system;
    means for amplifying audio signals, said amplifying means having a signal input coupled to said first output for receiving said deemphasized audio signals, having a control input for receiving a gain control signal, and having an output at which amplified signals are developed;
    means exhibiting a bandpass filter characteristic, and having an input for receiving said dbx encoded audio signals, and producing a control signal at a second output;
    means for detecting the peak amplitude of a signal, said peak detecting means having an input coupled to said second output for receiving said control signal, and having an output at which a peak detected control signal is developed; and
    means for integrating a signal, said integrating means having an input coupled to said output of said peak detecting means for receiving said peak detected control signal, and an output at which is developed said gain control signal, said output of said integrating means being coupled to said control input of said amplifier means;
    said wideband expander including no variable deemphasis means for performing spectral expansion of said dbx encoded audio signal.

6. The wideband expander of claim 5, wherein said peak detector means detects negative transitions of said control signal.

7. The wideband expander of claim 5, further comprising:
    a second means exhibiting a fixed lowpass filter characteristic and coupled to said output of said amplifier means for receiving said expanded audio signals, said second lowpass filter means applying a second fixed deemphasis to said expanded audio signals and producing further filtered audio signals at an output.

8. The wideband expander of claim 5, wherein said amplifying means is a differential amplifier.

9. The wideband expander of claim 5, wherein said rolloff frequency of said lowpass filter means is approximately 300 Hz.

10. In a television receiver, a wideband expander circuit for decoding audio signals which were encoded in accordance with the BTSC multichannel sound system standard including dbx companding, said wideband expander circuit including only a single control signal input, comprising:
    means exhibiting a fixed lowpass filter characteristic and having an input for receiving said dbx encoded audio signals, said lowpass filter means applying a fixed deemphasis to said encoded audio signals and producing a deemphasized audio signal at a first output, said lowpass filter characteristic exhibiting a rolloff at a frequency less than half of the rolloff frequency exhibited by fixed lowpass filters of the dbx system;

means for amplifying audio signals, said amplifying means having a signal input coupled to said first output for receiving said deemphasized audio signals, having a control input for receiving a gain control signal, and having an output at which amplified signals are developed;

means exhibiting a bandpass filter characteristic, and having an input for receiving said dbx encoded audio signals, and producing a control signal at a second output; and means for detecting the peak amplitude of a signal, said peak detecting means having an input coupled to said second output for receiving said control signal, and having an output at which a peak detected control signal is developed, said output of said peak detecting means being coupled to said control input of said amplifier means.

* * * * *